(12) United States Patent
Maekawa

(10) Patent No.: US 10,676,053 B2
(45) Date of Patent: Jun. 9, 2020

(54) POWER SOURCE DEVICE

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Kosei Maekawa, Yokkaichi (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 187 days.

(21) Appl. No.: 16/075,368

(22) PCT Filed: Feb. 27, 2017

(86) PCT No.: PCT/JP2017/007360
§ 371 (c)(1),
(2) Date: Aug. 3, 2018

(87) PCT Pub. No.: WO2017/159308
PCT Pub. Date: Sep. 21, 2017

(65) Prior Publication Data
US 2019/0071038 A1    Mar. 7, 2019

(30) Foreign Application Priority Data

Mar. 15, 2016    (JP) ................................. 2016-050898

(51) Int. Cl.
*B60R 16/033*    (2006.01)
*H02H 7/26*    (2006.01)
(Continued)

(52) U.S. Cl.
CPC ............ *B60R 16/033* (2013.01); *B60R 16/03* (2013.01); *H02H 3/16* (2013.01); *H02H 7/26* (2013.01);
(Continued)

(58) Field of Classification Search
CPC . B60R 16/03; H02H 7/26; H02H 3/16; H02H 9/02; H02J 2207/20; H02J 7/00;
(Continued)

(56) References Cited

U.S. PATENT DOCUMENTS

| 10,179,519 B2* | 1/2019 | Schmidt .................. B60L 58/12 |
| 2005/0029867 A1* | 2/2005 | Wood .................... H02J 7/1423 |
| | | 307/10.1 |

(Continued)

FOREIGN PATENT DOCUMENTS

| JP | 2011-243382 A | 12/2011 |
| JP | 2015-217837 A | 12/2015 |
| JP | 2015-221595 A | 12/2015 |

OTHER PUBLICATIONS

Mar. 21, 2017 International Search Report issued in International Patent Application No. PCT/JP2017/007360.

*Primary Examiner* — Jared Fureman
*Assistant Examiner* — Duc M Pham
(74) *Attorney, Agent, or Firm* — Oliff PLC

(57) ABSTRACT

A power source device that includes a first battery; a second battery; a power supply line that supplies power to a plurality of loads; a power source line that connects the first battery and the power supply line; a first fuse that is connected between the power source line and the power supply line; a fuse portion whose current capacity is made smaller or larger than a current capacity of the first fuse depending on whether a potential of the power source line is higher or lower than a reference potential; and a first switch (Continued)

that is connected between the second battery and the fuse portion, and is connected to the power supply line via the fuse portion.

10 Claims, 3 Drawing Sheets

(51) Int. Cl.
*B60R 16/03* (2006.01)
*H02J 7/00* (2006.01)
*H02H 3/16* (2006.01)
*H02H 9/02* (2006.01)
*H01H 85/04* (2006.01)
*H03K 5/24* (2006.01)

(52) U.S. Cl.
CPC .............. *H02H 9/02* (2013.01); *H02J 7/00* (2013.01); *H01H 85/04* (2013.01); *H03K 5/24* (2013.01)

(58) Field of Classification Search
CPC .......... H02J 2310/46; H01H 2300/018; H01H 85/04; H03K 5/24
See application file for complete search history.

(56) References Cited

U.S. PATENT DOCUMENTS

2017/0080883 A1\* 3/2017 Yasunori ............... B60R 16/033
2017/0225634 A1\* 8/2017 Yasunori ................ H02J 7/34

\* cited by examiner

POWER SOURCE DEVICE

BACKGROUND

This application is the U.S. National Phase of PCT/JP2017/007360 filed Feb. 27, 2017, which claims priority form JP 2016-050898 filed Mar. 15, 2016, the entire disclosure of which is incorporated herein by reference.

The present disclosure relates to a power source device, and particularly to an onboard power source device that includes a plurality of batteries.

For an onboard power source device, a technique is known in which a second battery is mounted in addition to a lead battery that has often been used conventionally. The second battery is charged with regenerative energy of the vehicle, and supplies the regenerative energy to an electric load (hereinafter referred to simply as "load", and a plurality of loads will be referred to as "load group") mounted on the vehicle. This technique is advantageous in improving fuel economy.

For example, a technique is known in which a connection switch is provided between two batteries so as to connect and disconnect the two batteries. By turning off the connection switch, the load is driven by only one of the batteries (i.e., the second battery described above), and thus efficient use of energy can be achieved. By turning on the connection switch, electric power can be supplied to the load even if one of the batteries fails (hereinafter, also referred to as "power supply"). That is, this power supply configuration has redundancy. An example of this technique is disclosed in JP2014-34288 A.

SUMMARY

A fuse box is provided to supply power from a main battery (equivalent to the lead battery described above) or a sub-battery (equivalent to the second battery described above) to a load from the viewpoint of ensuring safety thereof. Power is supplied from the main battery or the sub-battery to the fuse box by using a group of wires, which is commonly called wire harness. In order to implement redundant power supply as described above, it is desired to provide a power supply path for each of the main battery and the sub-battery.

With a technique in which power is simply supplied to a load by using two paths, even if an open circuit failure occurs in one of the paths, due to its redundancy, power can be supplied to the load from the other path. However, if a ground fault occurs in one of the paths, the voltage drops in both paths, as a result of which power is unlikely to be supplied to the load.

An exemplary aspect of the disclosure provides a technique with which power supply to the load can be easily maintained in the event of a ground fault occurring in one of the paths.

A power source device according to a first aspect includes: a first battery; a second battery; a power supply line that supplies power to a plurality of loads; a power source line that connects the first battery and the power supply line; a first fuse that is connected between the power source line and the power supply line; a fuse portion whose current capacity is made smaller or larger than a current capacity of the first fuse depending on whether a potential of the power source line is higher or lower than a reference potential; and a first switch that is connected between the second battery and the fuse portion, and is connected to the power supply line via the fuse portion.

A power source device according to a second aspect is the power source device according to the first aspect, wherein the fuse portion includes: a second fuse whose current capacity is smaller than the current capacity of the first fuse; a relay that includes a first terminal that is connected to a fuse portion side of the first switch, a second terminal, and a third terminal that is connected to the power source line, the first terminal and the second terminal being electrically disconnected or connected depending on whether a potential of the third terminal is high or low; and a third fuse that is connected between the second terminal and the power supply line, the third fuse being connected in parallel to the second fuse in response to the first terminal and the second terminal being electrically connected, and a current capacity of the parallel connection of the third fuse and the second fuse being larger than the current capacity of the first fuse.

A power source device according to a third aspect is the power source device according to the second aspect, wherein the third fuse has a current capacity smaller than the current capacity of the first fuse.

A power source device according to a fourth aspect is the power source device according to the second aspect or the third aspect, wherein the current capacity of the third fuse is smaller than the current capacity of the second fuse.

A power source device according to a fifth aspect is the power source device according to any one of the second to fourth aspects, wherein the fuse portion further includes a fourth fuse that is provided between the third terminal and the power source line, and whose current capacity is smaller than the current capacity of any of the first fuse, the second fuse, and the third fuse.

A power source device according to a sixth aspect is the power source device according to any one of the second to fifth aspects, wherein the relay further includes; a diode that includes an anode that is connected to the first terminal, and a cathode; a capacitor that is charged via the diode; a current limiting resistor and a relay coil that are connected to each other in series between the cathode of the diode and the third terminal; and a contactor that is connected between the first terminal and the second terminal, and is made conductive or non-conductive depending on whether or not an electric current flows through the relay coil.

A power source device according to a seventh aspect is the power source device according to any one of the second to fifth aspects, wherein the relay further includes: a DC/DC converter that includes an input terminal that is connected to the first terminal, and an output terminal; a current limiting resistor and a relay coil that are connected to each other in series between the output terminal and the third terminal; and a contactor that is connected between the first terminal and the second terminal, and is made conductive or non-conductive depending on whether or not an electric current flows through the relay coil.

A power source device according to an eighth aspect is the power source device according to the sixth aspect or the seventh aspect, wherein the relay further includes: a switch that is provided between the third terminal and the series connection of the current limiting resistor and the relay coil; and a comparator that turns the switch on or off depending on whether the potential of the third terminal is higher or lower than a potential of the first terminal.

A power source device according to a ninth aspect is the power source device according to any one of the sixth to eighth aspects, wherein the relay coil and the contactor form a relay.

A power source device according to a tenth aspect is the power source device according to any one of the second to ninth aspects, further including a second switch that is provided between the first battery and the second battery, and not by way of the power source line and the first switch.

According to the first aspect, if a ground fault occurs on the power source line, because the current capacity of the fuse portion is larger than the current capacity of the first fuse, the first fuse is blown while the fuse portion remains unblown. As a result, the power supply from the second battery to the power supply line is maintained, with the power supply line being separated from the point where the ground fault occurred. If a ground fault occurs on the fuse portion side of the first switch, because the current capacity of the fuse portion is smaller than the current capacity of the first fuse, the fuse portion is blown while the first fuse remains unblown. As a result, the power supply from the first battery to the power supply line is maintained, with the power supply line being separated from the point where the ground fault occurred.

According to the second aspect, if a ground fault occurs on the power source line, the first fuse is blown while the second fuse remains unblown. If a ground fault occurs on the fuse portion side of the first switch, the second fuse is blown while the first fuse remains unblown. As a result, the power supply to the power supply line is maintained, with the power supply line being separated from the point where the ground fault occurred.

According to the third aspect, if a ground fault occurs at the first terminal of the relay, the third fuse is blown while the first fuse remains unblown, and as a result of the third fuse being blown, the point where the ground fault occurred is disconnected from the power source line, and the supply of power to the power supply line by the power source line is maintained.

According to the fourth aspect, if a ground fault occurs at the second terminal of the relay, the third fuse is blown while the first fuse and the second fuse remain unblown, and as a result of the third fuse being blown, the point where the ground fault occurred is disconnected from the power supply line, and the power supply from the first battery and the second battery to the power supply line is maintained.

According to the fifth aspect, if a ground fault occurs at the third terminal of the relay, the fourth fuse is blown while the first fuse, the second fuse, and the third fuse remain unblown, and as a result of the fourth fuse being blown, the point where the ground fault has occurred is disconnected from the power supply line, and the power supply from the first battery and the second battery to the power supply line is maintained.

The sixth aspect or the seventh aspect contributes to implementation of a relay.

According to the eighth aspect, it is possible to handle the case where the potential of the power source line drops if a ground fault occurs on the second battery side of the first switch.

According to the ninth aspect, a known relay can be used in the relay, and thus the configuration can be simplified.

According to the tenth aspect, the power charging paths of both the first battery and the second battery are realized by turning on the second switch, and in order to separate a ground fault that has occurred in the power source line from the second battery, or to separate a ground fault that has occurred at one terminal of the first switch from the first battery, the second switch is turned off.

DETAILED DESCRIPTION OF EMBODIMENTS

Figure 5:
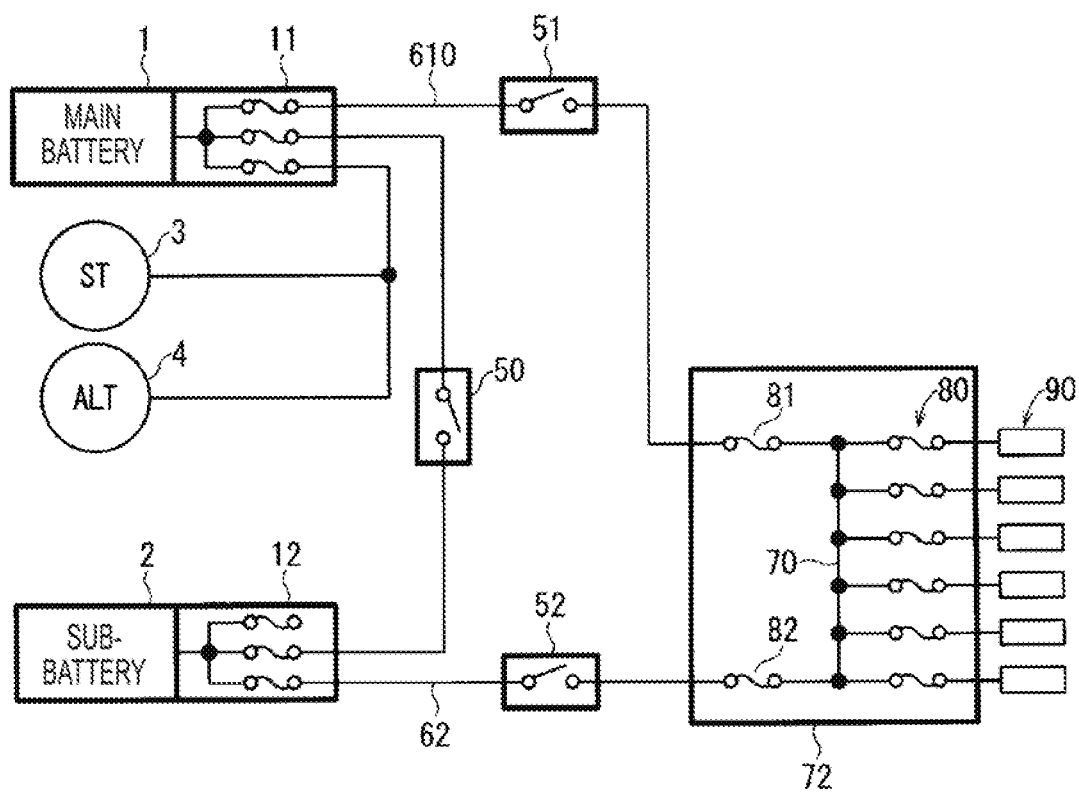
FIG. 5 is a block diagram showing a comparative example.

Prior to describing embodiments, as a comparative example for comparison with the embodiments, a configuration example of an onboard power source device is shown in a block diagram in FIG. 5. A first battery 1 is connected to a power source trunk line 610 via a fuse group 11, and a second battery 2 is connected to a power source trunk line 62 via a fuse group 12. The first battery 1 functions as a power source for driving a starter 3, and is charged by an alternator 4. A switch 50 connects the fuse groups 11 and 12, and transfers regenerative power from the alternator 4 to the second battery 2.

Switches 51 and 52 are respectively provided in the power source trunk lines 610 and 62. A fuse box 72 includes a fuse group 80, and supplies power from a power supply line 70 to an external load group 90 via the fuse group 80. The fuse box 72 includes fuses 81 and 82 that are connected to the power supply line 70. The fuse 81 is connected to the fuse group 11 via the switch 51, and the fuse 82 is connected to the fuse group 12 via the switch 52.

The switches 51 and 52 are on during normal operation, and the switch 50 is turned on while, for example, charging the second battery 2 with regenerative energy from the alternator 4 via the fuse group 11.

With the configuration described above, if a ground fault occurs on the power source trunk line 610 on the first battery 1 side of the switch 51, by turning off the switches 50 and 51, the ground fault is separated from both the fuse box 72 and the second battery 2. Then, by keeping the switch 52 on, in the power supply line 70, the supply of power from the second battery 2 to the power supply line 70 via the power source trunk line 62 and the fuse 82 is maintained.

Likewise, if a ground fault occurs on the power source trunk line 62 on the second battery 2 side of the switch 52, by turning off the switches 50 and 52, the ground fault is separated from both the fuse box 72 and the first battery 1. Then, by keeping the switch 51 on, in the power supply line 70, the supply of power from the first battery 1 to the power supply line 70 via the power source trunk line 610 and the fuse 81 is maintained.

However, if a ground fault occurs on the power source trunk line 610 on the fuse box 72 side of the switch 51, even when the switch 50 is turned off, the potential of the power source trunk line 62 drops via the fuses 81 and 82, and the power supply line 70. Conversely, if a ground fault occurs on the power source trunk line 62 on the fuse box 72 side of the switch 52, even when the switch 50 is turned off, the potential of the power source trunk line 610 drops via the fuses 81 and 82, and the power supply line 70.

Assuming the cases described above, desirably, the current capacities of the fuses 81 and 82 are set such that at least one of the fuses 81 and 82 is blown in the event of a ground fault. However, if both fuses are blown, power cannot be supplied to the power supply line 70 from either of the first battery 1 and the second battery 2.

By setting the current capacity of the fuse 81 to be smaller than the current capacity of the fuse 82, if a ground fault occurs on the power source trunk line 610 on the fuse box 72 side of the switch 51, the fuse 81 can blow while the fuse 82 remains unblown. Accordingly, by turning off at least one of the switches 50 and 51, the ground fault is separated from both the fuse box 72 and the second battery 2. As a result, the supply of power to the power supply line 70 from the second battery 2 via the switch 52 (that has been kept on) is maintained.

However, based on the current capacity relationship described above, even if a ground fault occurs on the power source trunk line 62 on the fuse box 72 side of the switch 52, the fuse 81 is blown while the fuse 82 remains unblown. In this case, a problem occurs in that, in addition to power not being supplied to the power supply line 70 from the power source trunk line 62 in which a ground fault has occurred, power is not supplied to the power supply line 70 from the power source trunk line 610 even when the switch 51 is conductive.

Setting the current capacity of the fuse 82 to be smaller than the current capacity of the fuse 81 causes the same problem described above except that the power source trunk line 610 is replaced by the power source trunk line 62. According to the following embodiments, this problem is overcome.

First Embodiment

Configuration

Figure 1:
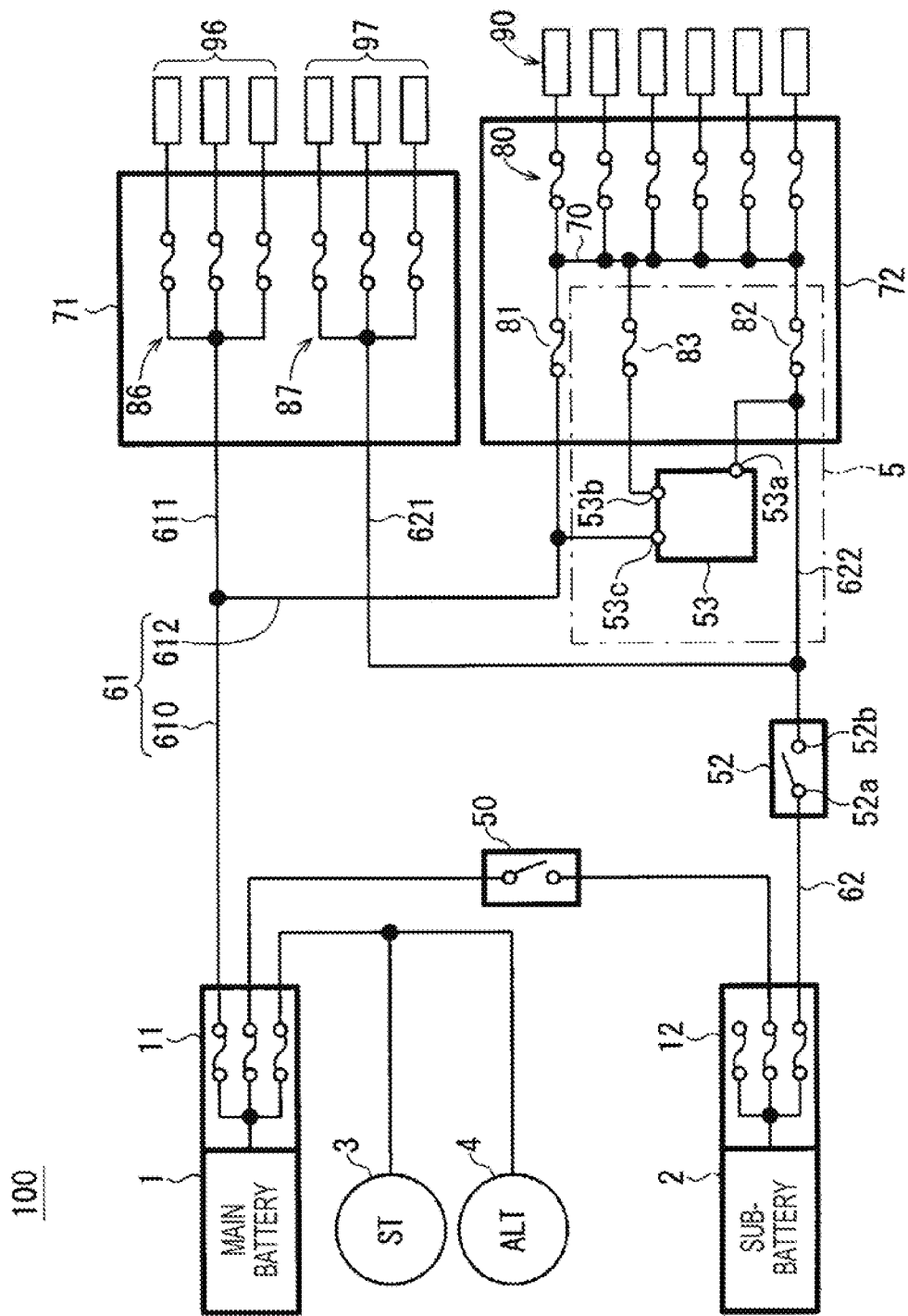
FIG. 1 is a block diagram showing a configuration of a power source device according to a first embodiment.

FIG. 1 is a block diagram showing a configuration of a power source device 100 according to the present embodiment. The power source device 100 is an onboard power source device. The power source device 100 includes a first battery 1, a second battery 2, and a fuse box 72. The fuse box 72 includes a power supply line 70, and the power supply line 70 supplies power to an external load group 90 via a fuse group 80.

Here, an example will be described in which the first battery 1 serves as a main battery, and the second battery 2 serves as a sub-battery. As the main battery; for example, a lead storage battery is used. As the sub-battery, for example, a lithium ion battery or an electric double layer capacitor is used. The first battery 1 is charged by an alternator 4. The first battery 1 is also connected to a starter 3, and provides an electric current to the starter 3 to drive the starter 3. The first battery 1 is connected to the starter 3 and the alternator 4 via a fuse group 11.

The first battery 1 and the second battery 2 are connected by a switch 50. The switch 50 is provided between the first battery 1 and the second battery 2, and not by way of a power source trunk line 610 and a switch 52. The switch 50 is realized by, for example, a known relay. More specifically, the switch 50 is connected to the first battery 1 via the fuse group 11, and connected to the second battery 2 via a fuse group 12. The switch 50 is made conductive when, for example, the second battery 2 is charged with regenerative power generated by the alternator 4.

The second battery 2 is connected to a power source trunk line 62 via the fuse group 12, and the power source trunk line 62 is connected to one terminal 52a of the switch 52. However, in the following operation, a case will be considered where the fuse groups 11 and 12 are not blown. Accordingly, the following description will be given, assuming that the fuse group 11 is included in the first battery 1, and the fuse group 12 is included in the second battery 2. The fuse groups 11 and 12 are realized as, for example, battery fuse terminals.

A fuse box 71 includes fuse groups 86 and 87. The fuse groups 86 and 87 are respectively connected to power source branch lines 611 and 621. The power source branch line 611 and a power source branch line 612 are connected to the first battery 1 via the power source trunk line 610, and the power source branch line 621 and a power source branch line 622 are connected to another terminal 52b of the switch 52.

The first battery 1 supplies power to an external load group 96 via the power source trunk line 610, the power source branch line 611, and the fuse group 86. The second battery 2 supplies power to an external load group 97 via the switch 52 in a conductive state, the power source branch line 621, and the fuse group 87. The power source branch line 611 is not connected to the fuse group 87, and the power source branch line 621 is not connected to the fuse group 86. Accordingly, if a failure occurs in the first battery 1, or a ground fault occurs on the power source trunk line 610, or the power source branch line 611 or 612, even when the switch 52 is conductive, power supply via the fuse group 86 cannot, be performed normally. Also, if a failure occurs in the second battery 2, or a ground fault occurs on the power source branch line 621 or 622, power supply via the fuse group 87 cannot be performed normally.

Unlike the fuse box 71 described above, as will be described below, the fuse box 72 has a redundant power supply path that supplies power from the power supply line 70 to the load group 90 even if a failure or a ground fault as described above occurs.

The fuse box 72 further includes fuses 81, 82, and 83 that are connected to the power supply line 70. Specifically, the fuse 81 is connected between the power source branch line 612 and the power supply line 70, and the fuse 82 is connected between the terminal 52b of the switch 52 and the power supply line 70 via the power source branch line 622 (or in other words, the terminal 52b is connected to the power supply line 70 via the power source branch line 622 and the fuse 82). The power source branch line 612 is connected to the power source trunk line 610, and thus both can be collectively interpreted as a power source line 61 that connects the first battery 1 and the power supply line 70. Also, the power supply line 70 can be interpreted as having the function of supplying power to the load group 90. The above interpretations apply even when the fuse group 80 is included in the power supply line 70. It can also be said that the fuse 81 connects the power source line 61 and the power supply line 70.

The power source trunk lines 610 and 62, and the power source branch lines 611, 612, 621, and 622 are provided in a vehicle in the form of, for example, a wire harness.

The power source device 100 further includes a relay portion 53. In the present embodiment, the relay portion 53 is provided outside the fuse box 72. The relay portion 53 includes terminals 53a, 53b, and 53c. The terminal 53a is connected to the terminal 52b, and the terminal 53c is connected to the power source branch line 612. The terminals 53a and 53b are electrically disconnected (turned off) or electrically connected (turned on) depending on whether the potential of the terminal 53c is higher or lower than the reference potential (a potential lower than the lower limit voltages of the first battery 1 and the second battery 2 during normal operation).

As a result of the terminals 53a and 53b being electrically connected, the fuses 82 and 83 are connected in parallel between the terminal 52b and the power supply line 70. The current capacity of the parallel connection is larger than the current capacity of the fuse 81. The current capacity of the fuse 82 is smaller than the current capacity of the fuse 81.

As described above, because the power supply line 70 includes a redundant power supply path that is composed of the power source branch lines 612 and 622, even if a ground fault occurs on the power source trunk line 610 and the power source branch lines 611 and 612, power can be supplied to the power supply line 70 from the second battery 2. Also, even if a ground fault occurs in the power source trunk line 62 and the power source branch lines 621 and 622, power can be supplied to the power supply line 70 from the first battery 1. Hereinafter, a description will be given of operations of the power source device 100 according to whether or not a ground fault has occurred.

Normal Operation

If a ground fault has not occurred in any of the power source trunk lines 610 and 62, and the power source branch lines 611, 612, 621, and 622, power is supplied from the first battery 1 to the fuse boxes 71 and 72. By making the switch 52 conductive, power is supplied from the second battery 2 to the fuse boxes 71 and 72.

In this case, the switch 50 is switched between a conductive (on) state and a non-conductive (off) state according to a request such as a request regarding the need to charge the second battery 2. That is, the power charging path from the alternator 4 to the second battery 2 is realized by turning on the switch 50.

Operation in the Event of First Ground Fault

If a ground fault occurs on the power source trunk line 62 (this is a ground fault on the second battery 2 side of the switch 52, and can be regarded as a ground fault at the terminal 52*a*), the switches 50 and 52 are made non-conductive so as to separate the power source branch lines 611, 61.2, 621, and 622 from the point where the ground fault occurred. As a result, power cannot be supplied to the fuse box 71 from the second battery 2, but the supply of power to the fuse box 72, more specifically, the supply of power from the first battery 1 to the power supply line 70 is ensured by the power source line 61.

Operation in the Event of Second Ground Fault

If a ground fault occurs on the power source branch line 621 or the power source branch line 622 (this is a ground fault on the fuse 82 side of the switch 52, and can be regarded as a ground fault at the terminal 52*b*), even when the switch 50 is non-conductive, the power source line 61 is connected to the ground fault via the fuses 81 and 82, and the power supply line 70.

The current capacity of the fuse 82 is smaller than that of the fuse 81. Accordingly, due to the ground fault, the fuse 82 is blown while the fuse 81 remains unblown. As a result, the power supply line 70 is separated from the power source branch line 622. Thus, by making the switch 50 non-conductive, the first battery 1 and the power source line 61 are separated from the point where the ground fault occurred. Also, by making the switch 52 non-conductive, the second battery 2 is separated from the ground fault point, and it is therefore possible to avoid the occurrence of a large current caused by the ground fault.

The potential of the power source line 61 is held at the potential of the first battery 1, the potential of the terminal 53*c* is high, and the terminals 53*a* and 53*b* are electrically disconnected. Accordingly, in this operation, an electric current does not flow through the fuse 83.

As a result of the switches 50 and 52 being made non-conductive, power cannot be supplied from the second battery 2 to the fuse box 71, but the supply of power to the fuse box 72, more specifically the supply of power to the power supply line 70 is ensured by the power source line 61.

Operation in the Event of Third Ground Fault

If a ground fault occurs on the power source trunk line 610, or the power source branch line 611 or 612 (this can be regarded as a ground fault on the power source line 61 because the power source branch line 612 is connected to the power source trunk line 610 and the power source branch line 611), even when the switch 50 is non-conductive, the power source trunk line 62, and the power source branch lines 621 and 622 are connected to the ground fault via the fuses 81 and 82, and the power supply line 70. Accordingly, the potential of the terminal 53*c* drops to the ground potential, and the terminals 53*a* and 53*b* are electrically connected. Thus, in this operation, the fuses 82 and 83 are connected in parallel, and the parallel connection is connected in series to the fuse 81 between the power source branch line 622 and the point where the ground fault occurred.

Because the current capacity of the parallel connection is larger than the current capacity of the fuse 81, due to the ground fault, the fuse 81 is blown while the fuses 82 and 83 remain unblown. As a result, the fuses 82 and 83 are not blown. By making the switch 50 non-conductive, the second battery 2 and the power source branch lines 621 and 622 are separated from the point where the ground fault occurred, and it is therefore possible to avoid the occurrence of a large current caused by the ground fault.

Power cannot be supplied from the first battery 1 to the fuse box 72, but the supply of power to the fuse box 72, more specifically, the supply of power to the power supply line 70 via the switch 52 that remains conductive is ensured by the power source branch line 622.

Specific Example of Relay Portion 53

Figure 2:
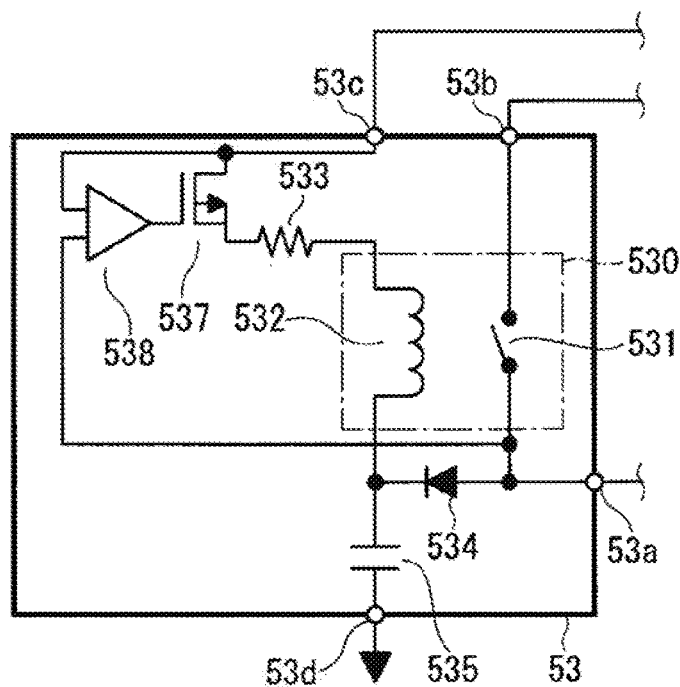
FIG. 2 is a circuit diagram showing an example of a structure of a relay portion.

FIG. 2 is a circuit diagram showing an example of a structure of the relay portion 53. In other words, the configuration described with reference to FIG. 2 contributes to implementation of the relay portion 53.

In this example, the relay portion 53 is realized as a module including a relay 530, a current limiting resistor 533, a diode 534, a capacitor 535, a switch (here, a field effect transistor) 537, and a comparator 538. In this example, the relay portion 53 further includes a terminal 53*d*, and the terminal 53*d* is grounded.

The relay 530 includes a contactor 531 and a relay coil 532. The contactor 531 is connected between the terminals 53*a* and 53*b*, and is made conductive (turned on) or non-conductive (turned off) depending on whether or not an electric current flows through the relay coil 532.

The diode 534 includes an anode that is connected to the terminal 53*a*, and a cathode that is connected to the capacitor 535, and the diode 534 is connected to the terminal 53*d* via the capacitor 535. The current limiting resistor 533, the relay coil 532, and the switch 537 are connected to each other in series between the cathode of the diode 534 and the terminal 53*c*. In the example shown in FIG. 2, the relay coil 532 is connected directly to the cathode of the diode 534 (or the relay coil 532 is connected to the terminal 53*d* via the capacitor 535), and the current limiting resistor 533 is connected to the terminal 53*c* via the switch 537.

The comparator 538 turns the switch 537 on or off based on the result of comparison between the potentials of the terminals 53*a* and 53*c*. Specifically, the comparator 538 turns off the switch 537 when the potential of the terminal 53*c* is higher than the potential of the terminal 53*a*, and the comparator 538 turns on the switch 537 when the potential of the terminal 53c is lower than the potential of the terminal 53a.

In the case where a ground fault has not occurred in the power source line 61, a phenomenon may be assumed in which the potential of the terminal 53c is higher than the potential of the terminal 53a. At this time, the switch 537 is turned off, and thus an electric current does not flow from the terminal 53c to the terminals 53a and 53d, the potential of the terminal 53c is held at the potential of the first battery 1, and an electric current does not flow through the relay coil 532, and the terminals 53a and 53b are not electrically connected.

Although the terminal 53d is grounded, the capacitor 535 is present between the terminal 53d and the terminal 53c, and the capacitor 535 is charged via the diode 534 before a ground fault occurs on the power source branch line 622. Even if a ground fault occurs on the power source branch line 622, due to the function of the diode 534, the capacitor 535 does not discharge power to the power source branch line 622. Accordingly, the capacitor 535 holds substantially the voltage of the second battery 2.

If a ground fault occurs on the power source trunk line 62 (this can be regarded as a ground fault on the second battery 2 side of the switch 52), before the switches 50 and 52 are made non-conductive as explained in the section "Operation in the event of First Ground Fault", the potential of the power source line 61 may drop via the switch 50 and the fuse group 11, or the potential of the power source branch line 622 may drop via the switch 52. The same applies to the case where a ground fault occurs on the power source branch lines 621 and 622.

However, in the case where a ground fault has not occurred in the power source line 61, because the drop in the potential of the terminal 53c is not prominent, and the potential of the terminal 53c is higher than the potential of the terminal 53a that is close to the ground fault point, the switch 537 is turned off. Accordingly, even in the case where a ground fault has not occurred on the power source line 61, the terminals 53a and 53b are not electrically connected. Accordingly, the fuse 82 is blown as explained in the section "Operation in the event of Second Ground Fault".

That is, by using the relay portion 53 described here as an example, it is possible to blow the fuse 82 irrespective of whether the switch 50 is conductive or non-conductive so as to handle a ground fault that has occurred in any of the power source trunk line 62, and the power source branch lines 621 and 622.

In the case where a ground fault has not occurred in any of the power source trunk lines 610 and 62, and the power source branch lines 611, 612, 621, and 622, a phenomenon is also assumed in which the potential of the terminal 53c is lower than the potential of the terminal 53a. At this time, the switch 537 is turned on. However, if a ground fault does not occur in the power source line 61, little electric current flows through the relay coil 532, and thus the terminals 53a and 53b are not electrically connected.

On the other hand, if a ground fault occurs on the power source line 61, the potential of the terminal 53c drops to the ground potential. Accordingly, the switch 537 is turned on. Because the potential of the cathode of the diode 534 is kept at a high level due to the voltage held by the capacitor 535, an electric current flows through the relay coil 532. As a result, the contactor 531 is made conductive, and the fuse 81 is blown as explained in the section "Operation in the event of Third Ground Fault".

After the fuse 81 has been blown, an electric current flows from the power source branch line 622 to the point where the ground fault has occurred via the relay coil 532 without flowing through the power supply line 70. However, the current limiting resistor 533 limits the electric current flowing through the relay coil 532, and thus the electric current; flowing from the power source branch line 622 to the point where the ground fault has occurred is suppressed, and hindrance to the supply of power from the power source branch line 622 to the power supply line 70 can be reduced.

If a ground fault occurs on the power source trunk line 62, it is unnecessary to turn off the switch 537 if the potential of the power source line 61 does not drop due to making the switch 50 non-conductive or the like. Accordingly, for simplification, the comparator 538 may be removed, and the switch 537 may be short-circuit cleared. That is, only a series connection of the current limiting resistor 533, the relay coil 532, and the capacitor 535 may be provided between the terminals 53c and 53d. In other words, it is desirable to provide the switch 537 and the comparator 538 from the viewpoint of addressing the drop in the potential of the power source line 61 if a ground fault occurs on the power source trunk line 62.

In the first embodiment, because the relay portion 53 is provided outside the fuse box 72, outside of the fuse box 72, a ground fault may occur between the terminal 53a and the power source branch line 622, between the terminal 53a and the fuse 82, between the terminal 53b and the fuse 83, between the terminal 53c and the power source branch line 612, and between the terminal 53c and the fuse 81.

If a ground fault occurs between the terminal 53a and the power source branch line 622, and between the terminal 53a and the fuse 82, the fuse 82 is blown as described in the section "Operation in the event of Second Ground Fault" of the first embodiment.

Assuming the case where a ground fault occurs between the terminal 53b and the fuse 83, it is desirable that the current capacity of the fuse 83 is smaller than the current capacity of the fuse 81. The reason for this is as follows. Due to the ground fault, the fuse 83 is blown while the fuse 81 remains unblown, and as a result of the fuse 83 being blown, the point where the ground fault occurred is disconnected from the power source trunk line 610, and the power source branch lines 611 and 612. Accordingly, the supply of power to the power supply line 70 is thereby maintained.

Also, it is desirable that the current capacity of the fuse 83 is smaller than the current capacity of the fuse 82. The reason for this is as follows. Due to the ground fault, the fuse 83 is blown while the fuses 81 and 82 remain unblown, and as a result of the fuse 83 being blown, the point where the ground fault occurred is disconnected from the power supply line 70. Accordingly, the supply of power from the first battery 1 and the second battery 2 to the power supply line 70 is maintained.

For example, by setting the ratio of current capacity of the fuses 81, 82, and 83 to 6:4:3, the following relationship is achieved: the current capacity of the fuse 82 is smaller than the current capacity of the fuse 81, the current capacity of the fuse 83 is smaller than the current capacities of the fuses 81 and 82, and the current capacity of the parallel connection of the fuses 82 and 83 is larger than the current capacity of the fuse 81.

A method for addressing the case where a ground fault occurs between the terminal 53c and the power source branch line 612, and between the terminal 53c and the fuse 81 in the outside of the fuse box 72 will be described as a second embodiment.

Even if an open circuit failure occurs between the terminal 53a and the power source branch line 622, between the terminal 53a and the fuse 82, between the terminal 53b and the fuse 83, between the terminal 53c and the power source branch line 612, and between the terminal 53c and the fuse 81 outside of the fuse box 72, it is obvious there is no problem in the supply of power from the first battery 1 and the second battery 2 to the power supply line 70.

Second Embodiment

Figure 3:
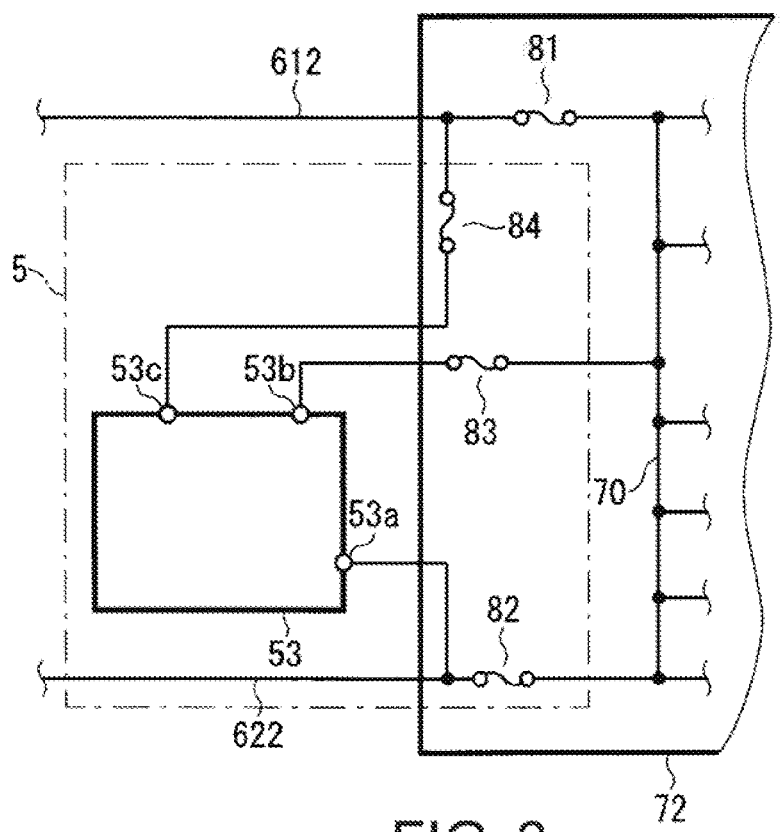
FIG. 3 is a block diagram showing a configuration of the vicinity of a relay portion and power source branch lines in a power source device according to a second embodiment.

FIG. 3 is a block diagram showing a configuration of the vicinity of a relay portion 53, and power source branch lines 612 and 622 in a power source device according to the present embodiment. The power source device according to the present embodiment is different from the power source device 100 according to the first embodiment in that a fuse 84 has been added between a terminal 53c and the power source branch line 612. Here, an example is shown in which the fuse 84 is included in a fuse box 72. In the description of the present embodiment, constituent elements that are the same as those described in the first embodiment are given the same reference numerals, and a description thereof will be omitted.

The current capacity of the fuse 84 is smaller than that of any of the fuses 81, 82, and 83. Accordingly, if a ground fault occurs between the terminal 53c and the power source branch line 612, and between the terminal 53c and the fuse 81 in the outside of the fuse box 72, the fuse 84 is blown while the fuses 81, 82, and 83 remain unblown, and the point where the ground fault occurred is thereby separated from the power source branch lines 612 and 622, and the power supply line 70.

In this way, even if a ground fault occurs between the terminal 53c and the power source branch line 612, and between the terminal 53c and the fuse 81 outside of the fuse box 72, the supply of power from the first battery 1 and the second battery 2 to the power supply line 70 is maintained.

Description of Generic Concept

With the above-described function of the relay portion 53, the relay portion 53, and the fuses 82 and 83 can be regarded as constituting a fuse portion 5 that has a current capacity as described below, and it can be interpreted that the terminal 52b is connected to the power supply line 70 via the fuse portion 5. That is, the current capacity of the fuse portion 5 is made smaller or larger than the current capacity of the fuse 81 depending on whether the potential of the power source line 61 is higher or lower than the reference potential. When the potential of the terminal 53c connected to the power source branch line 612 is high, the fuse portion 5 substantially functions as the fuse 82 (that has a current capacity smaller than that of the fuse 81). When the potential of the terminal. 53c is low, the fuse portion 5 substantially functions as the parallel connection of the fuses 82 and 83 (that has a current capacity larger than that of the fuse 81).

From this viewpoint, the above-described embodiment can be expressed as follows:

(i) if a ground fault occurs on the power source line 61, the fuse 81 is blown while the fuse portion 5 remains unblown. With this configuration, the supply of power from the second battery 2 to the power supply line 70 is maintained, with the power supply line 70 being separated from the point where the ground fault has occurred; and (ii) if a ground fault occurs on the terminal 52b side (the fuse portion 5 side of the switch 52), the fuse portion 5 is blown while the fuse 81 remains unblown. With this configuration, the supply of power from the first battery 1 to the power supply line 70 is maintained, with the power supply line 70 being separated from the point where the ground fault has occurred.

Because the power source branch line 622 is connected to the fuse portion 5, it can also be said that the switch 52 is connected between the second battery 2 and the fuse portion 5, and is connected to the power supply line 70 via the fuse portion 5. The fuse 84 may be included in the fuse portion 5.

Variations

In order to reduce the possibility of the occurrence of a ground fault between the terminal 53a and the power source branch line 622, between the terminal 53a and the fuse 82, between the terminal 53b and the fuse 83, between the terminal 53c and the power source branch line 612, and between the terminal 53c and the fuse 81 outside of the fuse box 72, it is desirable that the relay portion 53 is provided within the fuse box 72.

Alternatively, in the case where the relay portion 53 is provided outside the fuse box 72, it is desirable that the wires between the relay portion 53 and the fuse box 72 are short.

Figure 4:
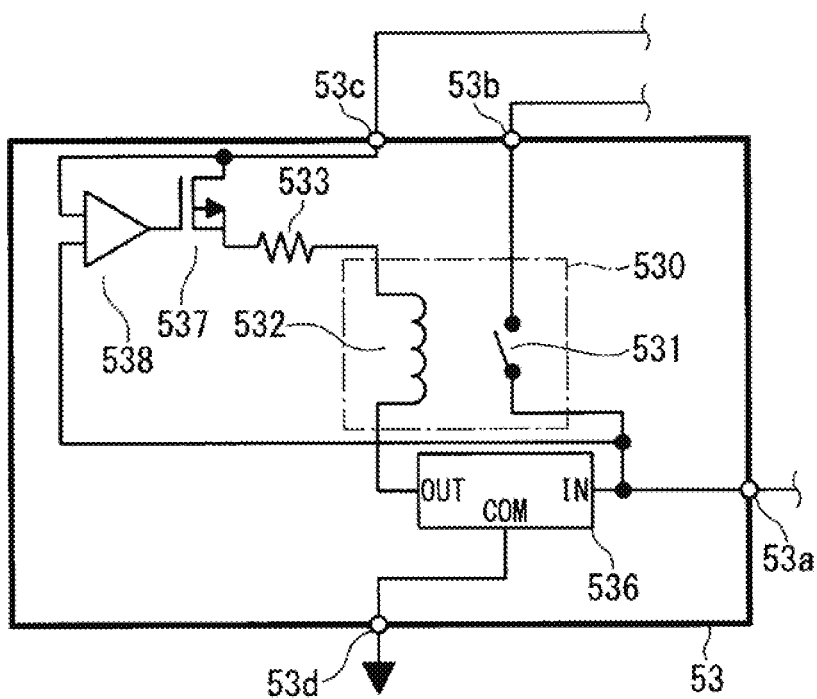
FIG. 4 is a block diagram showing an example of a configuration of a relay portion according to a variation.

FIG. 4 is a block diagram showing an example of a configuration of a relay portion 53 according to a variation. The configuration shown in FIG. 4 is the same as that shown in FIG. 2, except that the diode 534 and the capacitor 535 have been replaced by a DC/DC converter 536.

Specifically, an input terminal (indicated by IN in the diagram) of the DC/DC converter 536 is connected to a terminal 53a. A current limiting resistor 533 and a relay coil 532 are connected to each other in series between an output terminal (indicated by OUT in the diagram) of the DC/DC converter 536 and a terminal 53c. As shown in FIG. 2, FIG. 4 shows an example in which a switch 537 is provided between the terminal 53c and the series connection of the current limiting resistor 533 and the relay coil 532. The function of a comparator 538 of turning on or off the switch 537 is also the same as that described with reference to FIG. 2. A common terminal (indicated by COM in the diagram) of the DC/DC converter 536 is connected to a terminal 53d, and is grounded via, for example, the terminal 53d.

As in FIG. 2, a contactor 531 is connected between the terminals 53a and 53b, and is made conductive or non-conductive depending on whether or not an electric current flows through the relay coil 532.

The DC/DC converter 536 outputs a voltage that is about the same as that of the second battery 2 to between the output terminal and the common terminal of the DC/DC converter 536. With this configuration, if the potential of the terminal 53c drops, an electric current flows through the relay coil 532, and the contactor 531 is made conductive. Also, even if the potential of the terminal 53c is high, an electric current does not flow from the terminal 53c to the terminal 53a. Accordingly, even with this configuration, the relay portion 53 functions in the manner described in the first embodiment not only during normal operation but also during operation in the event of any of the first to third ground faults. In other words, the configuration according to the variation described above contributes to implementation of the relay portion 53.

Because the relay 530 including the contactor 531 and the relay coil 532 is known, the configuration of the relay portion 53 including the relay 530 is simplified. However, it is naturally understood that a relay 530 without a contactor 531 and a relay coil 532 can be used singly in the relay portion 53.

The configurations described in the embodiments and the variations above can be combined as appropriate unless there is no mutual contradiction.

The embodiments of the present disclosure have been described in detail above, but the embodiments given above are merely examples in all aspects, and thus the present disclosure is not limited thereto. It is understood that a number of variations that are not described herein are also encompassed within the scope of the present disclosure without departing from the scope of the present disclosure.

The invention claimed is:

1. A power source device comprising:
   a first battery;
   a second battery;
   a power supply line that supplies power to a plurality of loads;
   a power source line that connects the first battery and the power supply line;
   a first fuse that is connected between the power source line and the power supply line;
   a fuse portion whose current capacity is made smaller or larger than a current capacity of the first fuse depending on whether a potential of the power source line is higher or lower than a reference potential; and
   a first switch that is connected between the second battery and the fuse portion, and is connected to the power supply line via the fuse portion.

2. The power source device according to claim 1,
   wherein the fuse portion includes:
   a second fuse whose current capacity is smaller than the current capacity of the first fuse;
   a relay that includes a first terminal that is connected to a fuse portion side of the first switch, a second terminal, and a third terminal that is connected to the power source line, the first terminal and the second terminal being electrically disconnected or connected depending on whether a potential of the third terminal is high or low; and
   a third fuse that is connected between the second terminal and the power supply line, the third fuse being connected in parallel to the second fuse in response to the first terminal and the second terminal being electrically connected, and a current capacity of the parallel connection of the third fuse and the second fuse being larger than the current capacity of the first fuse.

3. The power source device according to claim 2,
   wherein the third fuse has a current capacity smaller than the current capacity of the first fuse.

4. The power source device according to claim 2,
   wherein the current capacity of the third fuse is smaller than the current capacity of the second fuse.

5. The power source device according to claim 2,
   wherein the fuse portion further includes a fourth fuse that is provided between the third terminal and the power source line, and whose current capacity is smaller than the current capacity of any of the first fuse, the second fuse, and the third fuse.

6. The power source device according to claim 2,
   wherein the relay further includes:
   a diode that includes an anode that is connected to the first terminal, and a cathode;
   a capacitor that is charged via the diode;
   a current limiting resistor and a relay coil that are connected to each other in series between the cathode of the diode and the third terminal; and
   a contactor that is connected between the first terminal and the second terminal, and is made conductive or non-conductive depending on whether or not an electric current flows through the relay coil.

7. The power source device according to claim 2,
   wherein the relay further includes:
   a DC/DC converter that includes an input terminal that is connected to the first terminal, and an output terminal;
   a current limiting resistor and a relay coil that are connected to each other in series between the output terminal and the third terminal; and
   a contactor that is connected between the first terminal and the second terminal, and is made conductive or non-conductive depending on whether or not an electric current flows through the relay coil.

8. The power source device according to claim 7,
   wherein the relay further includes:
   a switch that is provided between the third terminal and the series connection of the current limiting resistor and the relay coil; and
   a comparator that turns the switch on or off depending on whether the potential of the third terminal is higher or lower than a potential of the first terminal.

9. The power source device according to claim 7,
   wherein the relay coil and the contactor form a relay.

10. The power source device according to claim 2, further comprising
    a second switch that is provided between the first battery and the second battery, and not by way of the power source line and the first switch.

* * * * *